United States Patent [19]

Bionta et al.

[11] Patent Number: 5,382,342
[45] Date of Patent: Jan. 17, 1995

[54] FABRICATION PROCESS FOR A GRADIENT INDEX X-RAY LENS

[75] Inventors: Richard M. Bionta; Daniel M. Makowiecki; Kenneth M. Skulina, all of Livermore, Calif.

[73] Assignee: The United States of America as represented by the Department of Energy, Washington, D.C.

[21] Appl. No.: 4,767

[22] Filed: Jan. 14, 1993

[51] Int. Cl.⁶ .............................................. C23C 14/00
[52] U.S. Cl. ...................... 204/192.26; 204/192.13; 204/192.15; 204/192.27; 204/192.28; 204/192.33; 204/192.34
[58] Field of Search ...................... 204/192.15, 192.26, 204/192.27, 192.28, 192.34; 427/162; 156/643

[56] References Cited

U.S. PATENT DOCUMENTS

| | | | |
|---|---|---|---|
| 2,679,474 | 5/1954 | Pajes | 204/27 |
| 3,927,319 | 12/1975 | Wittry | 250/273 |
| 4,084,089 | 4/1978 | Zingaro et al. | 250/272 |
| 4,242,588 | 12/1980 | Silk et al. | 250/492 |
| 4,684,565 | 8/1987 | Abeles et al. | 428/220 |
| 4,693,933 | 9/1987 | Keem et al. | 428/333 |
| 4,785,470 | 11/1988 | Wood et al. | 378/84 |
| 4,877,479 | 10/1989 | McNeil et al. | 204/192.34 |
| 4,992,656 | 12/1991 | Clauser | 250/251 |

OTHER PUBLICATIONS

"Sputtered-Sliced Linear Zone Plates for 8 keV X-Rays", R. M. Bionta et al., International Symposium on X-Ray Microscopy, Aug. 31-Sep. 4, 1987, Brookhaven National Laboratory, pp. 142-145.

"Transmission Gratings That Diffract 8 keV Rays", R. M. Bionta Appl. Phys. Lett. 51 (10), 7 Sep. 1987.

"Sputtered-Sliced Multilayers:Zone Plates and Transmission Gratings For 8 keV Rays", R. M. Bionta et al., SPIE Annual Meeting, San Diego, Calif., Aug. 14-19, 1988.

"Transmission Optics For High-Energy X-Rays", Energy and Technology Review, Jul.-Aug. 1988, pp. 86-87.

"8 keV X-Ray Zone Plates", R. M. Bionta et al., SPIE vol. 1160 X-Ray/EUV Optics for Astronomy and Microscopy, 1989, pp. 12-18.

"Tabletop X-Ray Microscope Using 8 keV Zone Plates", R. M. Bionta et al., Optical Engineering, Jun. 1990, vol. 29 No. 6, pp. 576-580.

"Hard-X-Ray Lenses", R. M. Bionta et al., Energy and Technology Review, Sep.-Oct. 1991, pp. 8-14, published Jan. 17, 1992 (UCRL-52000-91-9-10).

Primary Examiner—R. Bruce Breneman
Assistant Examiner—Rodney G. McDonald
Attorney, Agent, or Firm—Henry Sartorio; Roger S. Gaither; William R. Moser

[57] ABSTRACT

A process for fabricating high efficiency x-ray lenses that operate in the 0.5-4.0 keV region suitable for use in biological imaging, surface science, and x-ray lithography of integrated circuits. The gradient index x-ray optics fabrication process broadly involves co-sputtering multi-layers of film on a wire, followed by slicing and mounting on block, and then ion beam thinning to a thickness determined by periodic testing for efficiency. The process enables the fabrication of transmissive gradient index x-ray optics for the 0.5-4.0 keV energy range. This process allows the fabrication of optical elements for the next generation of imaging and x-ray lithography instruments m the soft x-ray region.

31 Claims, 3 Drawing Sheets

FABRICATION PROCESS FOR A GRADIENT INDEX X-RAY LENS

The United States Government has rights in this invention pursuant to Contract No. W-7405-ENG-48 between the United States Department of Energy and the University of California for the operation of Lawrence Livermore National Laboratory.

BACKGROUND OF THE INVENTION

This invention relates to high efficiency x-ray lenses, particularly to a sputtered-sliced technique for fabrication of transmissive optics for x-rays, and more particular to a process for fabricating gradient index x-ray optics in the 0.5 to 4.0 keV energy region.

Prior to setting forth the background technology developments which have led to the present invention, the following definitions of terms used hereinafter is set forth, with synonyms for the terms appearing in parenthesis after each term.

Circular Optics (radially symmetric optics):
Transmissive optics showing radial symmetry.

Efficiency:
A ratio of the monoenergetic x-ray flux focused into first order to that incident on the active area of the optic. In general, the higher the efficiency, the better the optic.

Ion Beam Thinning. (ion beam polishing, ion milling):
A technique that uses a small ion gun with accelerating voltages typically less than 5 keV to remove material from a solid surface on the order of tens of Angstroms per second.

Lens:
A generic term referring to any transmissive focussing optic, including zone plates, phase plates, and gradient index phase plates.

Gradient Index Optic (blazed optic, gradient index zone plate):
A transmissive focussing optic whose index of refraction is a function of the distance across a zone. The zone boundaries are defined slightly different from that shown under the "zone plate equation", described hereinafter, to account for the phase shifting properties of a gradient index optic. A gradient index optic can be designed to be inherently more effective (approaching 100%) than a phase plate made of the same materials.

Phase Plate (phase zone plate):
A special case of the zone plate where the two materials are chosen such that when the final optic thickness is an odd integral multiple of pi-shifting-lengths, a local increase in focused intensity (and efficiency) is achieved. The maximum theoretical efficiency for a phase plate is 40%.

Sputter-Sliced Technique:
A fabrication method for making transmissive x-ray optics first by alternate sputter deposition of two materials onto flat or figured substrates or onto rotating wires. The optic is sliced normal to the film growth direction and initially thinned using standard metallographic techniques.

Transmissive Optic:
A generic class of optic where the incident wavefront is separated from the exiting wavefront by the optic. All transmissive optics discussed in the following description of the present invention will be focussing optics. This is in contrast to a reflective optic, where both wavefronts are on the same side of the optic.

Zone:
A radial distance in a transmissive optic whose boundaries correspond to a previously determined amount of phase shift between the face of the optic and the focus. The zone may be homogeneous, as in the case of a zone plate or phase plate, or vary in optical properties, as in the case of a gradient index optic.

Zone Plates (fresnel zone plate, Soret type zone plate):
A type of transmissive optic, characterized by alternating transparent and opaque zones, with the zone boundaries specifically placed to produce constructive interference at a desired focal point. Without any qualifiers, a zone plate relies solely on amplitude modulation; the maximum theoretical efficiency is 10%.

8 keV:
In the following description we refer to the Cu k-alpha radiation at 8.04 keV as "8 keV radiation".

Zone Plate Equation:
The relationship between the nth zone boundary location, $r_n$, x-ray wavelength, $\lambda$, and focal length, $f$, that is used for both zone plate and phase plate designs:
$r_n^2 = n\lambda f$.

Gradient Index Equation:
A gradient index optic has the zone boundaries placed according to $$r_n^2 = 2\lambda f.$$

Research and development has been directed to focussing electromagnetic radiation lying outside the visible spectrum, especially in the region of x-rays, for use in instruments, such as spectroscopes, microscopes, as well as for use in synchrotrons, x-ray lithography systems, x-ray mirrors, etc. These prior efforts are exemplified by U.S. Pat. No. 2,679,474 issued May 25, 1954 to W. S. Pajes, directed to a process of making optical zone plates for focusing x-ray energy; U.S. Pat. No. 3,927,319 issued Dec. 16, 1975 to D. B. Wittry, directed to a stepped curved crystal for an x-ray crystal spectrometer; U.S. Pat. No. 4,084,089 issued Apr. 11, 1978 to W. P. Zingaro et al., directed to an x-ray diffraction crystal for the analysis of x-rays having a wave-length of 50 Angstroms or greater; U.S. Pat. No. 4,242,588 issued Dec. 30, 1980 to J. K. Silk et al., directed to an x-ray lithography system for the production of microelectronic circuits; U.S. Pat. No. 4, 684,565 issued Aug. 4, 1987 to B. Abeles et al., directed to an x-ray mirror including repeated multi-layered materials; and U.S. Pat. No. 4,469,933 issued Sep. 15, 1987 to J. E. Keem et al., directed to x-ray dispersive and reflective structures.

Various techniques have been developed for the fabrication of x-ray optics or lenses, as well as other components for focusing and/or utilizing x-ray energy. Among these fabrication techniques is the sputtered-sliced technique defined above using alternate sputter deposition of two materials on substrates or rotating wires, whereafter the coated substrate or wire is sliced to a desired thickness and then thinned by metallographic techniques. It has been demonstrated that the sputtered-sliced technique can be used to fabricate both linear and radially symmetric phase shifting optics for 8 keV x-rays. The following articles illustrate prior work directed to lenses for 8 keV x-rays: R. M. Bionta, "Transmission gratings that diffract 8 keV x-rays", Appl. Phys. Lett. 51 725 (1987); R. M. Bionta et al., "Sputtered-sliced linear zone plates for 8 keV x-rays", UCRL-97118 dated Oct. 1987, International Symposium on X-Ray Microscopy, Aug. 31–Sep. 4, 1987, published in X-Ray Microscopy, D. Sayre et al. editors, Springer-Verlag, New York (1987); R .M. Bionta, "Transmissive Optics for High-Energy X-Rays", Energy and Technology Review, Lawrence Livermore National Laboratory, July–August 1988, pp. 86–87; R. M. Bionta et al., "Sputtered-Sliced Multilayers:Zone plates and transmission gratings for 8 keV x-rays", SPIE, 1988; R. M. Bionta et al., "8 keV X-Ray Zone Plates", X-Ray/EUV Optics for Astronomy and Microscopy", R. B. Hoover editor, SPIE Vol. 1160, 12 (1989); R. M. Bionta et al., "Tabletop x-ray microscope using 8 keV zone plates", Opt. Engrg. 29(6) (1990),576; and R. M. Bionta et al., "Hard-X-Ray Lenses", Energy & Technology Review, LLNL, September-October 1991, pp. 8–14.

It has been determined that the high aspect ratio necessary for transmissive optics for hard x-rays (greater than about 4 keV in energy) can readily be achieved by this technique. Also, an amplitude modulating transmissive optic using the sputtered-sliced technique has been demonstrated. In addition, it has been indicated that both phase shifting and blazed-phase shifting optics could be made using this technique, although no fabrication process has been published.

In view of experience in fabricating the 8 keV optics, it was found that the necessary final thicknesses and tolerances cannot be achieved with standard metallographic procedures, particularly for soft x-ray optics in the 0.5 to 4.0 keV region. There is a need for transmissive x-ray optics capable of efficient operation in the lower or soft x-ray energy levels.

This need has been fulfilled by the present invention which involves a process for fabricating transmissive gradient index x-ray optics for the 0.5–4.0 keV energy range, thereby expanding the state of the art in both the fabrication of sputtered-sliced optics and in soft x-ray optics by a unique polishing and testing sequence.

SUMMARY OF THE INVENTION

It is an object of the present invention to provide a transmissive gradient index x-ray optic for the 0.5–4.0 keV energy range.

A further object of the invention is to provide a process for fabricating transmissive gradient index x-ray optics.

It is a further object of the invention to provide a process for producing x-ray optics capable of efficient operation in the 0.5–4.0 keV energy range.

Another object of the invention is to provide for careful thickness control in optics used in the hard x-ray regime.

Another object of the invention is to provide an x-ray optics fabrication process which extends the sputtered-sliced technique and combines same with an ion thinning/polishing technique, including in-situ thinning and testing.

Another object of the invention is to provide an x-ray optics fabrication process wherein the sputtered-sliced technique is modified such that the films are co-sputtered to produce a concentration gradient across a zone which results in a gradient in the index of refraction, a gradient index optic.

Another object of the invention is to use ion thinning/polishing of a gradient index optic produced by a modified sputtered-sliced technique.

Another object of the invention is to provide an x-ray optics fabrication process in which a computer using a Kalman filter is used to acquire and analyze the signals from the sputtering chamber.

Still another object of the invention is to provide a process for forming a gradient index optic wherein ion thinning of the optic is monitored by periodically measuring the efficiency of the optic.

Other objects and advantages of the invention will become apparent from the following description taken in conjunction with the drawings which illustrate various process steps for producing a gradient index x-ray lens.

Basically, the fabrication process of this invention is a combination and/or modification of two prior known techniques; namely, the sputtered-sliced and the ion-milling (thinning) techniques. This invention provides an extension of the sputtered-sliced technique where instead of forming films by sputtering alternating layers of material on a substrate or rotating wire, the films are co-sputtered to produce a concentration gradient across a zone. Thus, when sliced the concentration gradient results in a gradient in the index of refraction, producing a gradient index optic. After the initial standard cutting and polishing, the thus formed optic is then further processed by careful thinning/polishing of the optic using a small ion gun. This ion-thinning allows sufficiently slow removal of material to fabricate optics of a final thickness less than 3 microns, with final desired thickness tolerances within 0.1 micron range. The ion-thinning is monitored by periodic measuring of the optic efficiency by placing it in an x-ray beam, and the ion-thinning is terminated when a desired optics efficiency or optic thickness is reached. The ion-thinning and efficiency testing can be done separately or done in-situ within a testing apparatus. Thus, this invention provides a process for fabricating transmissive gradient index x-ray optics for the 0.5–4.0 keV energy range, and thus provides an optic suitable for use in x-ray photoresists and synchrotron sources for x-ray lithography of integrated circuits using 8–13 Angstrom (0.95–1.55 keV) radiation. The invention expands the state of the art in both the fabrication of sputtered-sliced optics and in soft x-ray optics by the unique polishing and testing sequence.

BRIEF DESCRIPTION OF THE DRAWINGS

The accompanying drawings, which are incorporated into and form a part of the disclosure of the invention, illustrate components and/or operational steps and thus serve to explain the principles of the fabrication process of this invention.

DETAILED DESCRIPTION OF THE INVENTION

Figure 1:
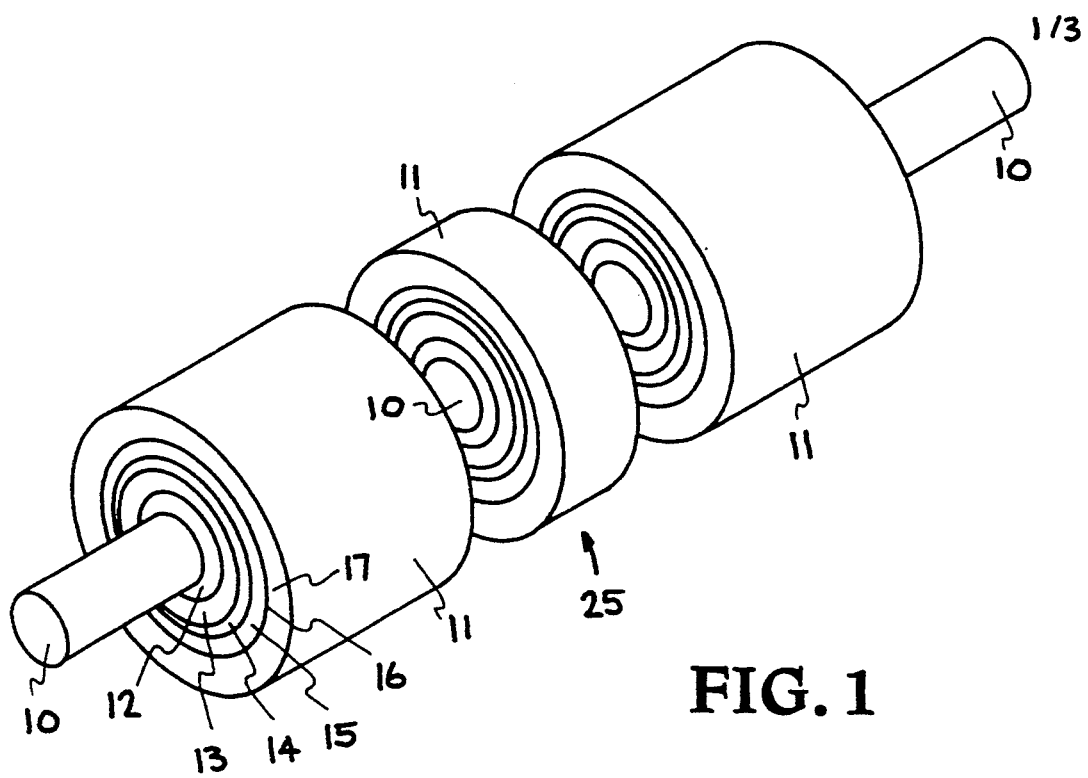
FIG. 1 illustrates a greatly enlarged optic fabricated by sputter-depositing multilayers of materials onto a rotating wire core, with the coated wire being sliced to produce the optic.

The present invention is a process for fabricating high efficiency x-ray lenses that operate at wavelengths suitable for use in x-ray lithography of integrated circuits, for example. Unlike prior technologies for fabricating transmissive x-ray optics this process enables fabrication of transmissive gradient index optics resulting in much higher optical efficiency and design flexibility. The process enables fabricating transmissive gradient index x-ray optics for the 0.5–4.0 keV energy range, and thus produces optics compatible with x-ray photoresists and synchrotron sources being designed for x-ray lithography of integrated circuits using 8–13 Angstroms (0.95–1.55 keV) radiation. Also, the gradient index optics can be used in biological imaging and surface science.

Basically, the fabrication process of this invention combines and modifies two processes; namely, the sputtered-sliced and ion-milling techniques, such that the end product is a gradient index optic having a desired efficiency. More specifically, the fabrication process is an extension of the sputtered-sliced technique wherein the films are formed on a substrate or wire by co-sputtering the materials rather than by sputtering alternating layers of the materials, to produce a concentration gradient across a zone resulting in a gradient in the index of refraction, a gradient index optic. Then by careful thinning/polishing of the optic using a small ion gun, material on the optic is removed sufficiently slow and uniform to enable periodic monitoring and testing of the optic for efficiency, such that the ion-thinning is terminated upon obtaining the desired efficiency of the optic. The thinning and monitoring may be carried out in-situ or done separately.

The fabrication processes of the invention basically involves the following operational steps or sequences: forming or obtaining a substrate or mounting block having a hole therein, plugging the hole with a dissolvable material, coating desired layers of desired material on one side of the substrate, forming or obtaining a co-sputtered gradient index optic, polishing the optic, mounting the polished side of the optic over the multilayers on the substrate, removing a portion of the optic, removing the material from the hole in the substrate, ion thinning the optic to a desired thickness and efficiency determined by monitoring and periodic testing, thereby producing a high efficiency gradient index x-ray lens that operates at desired wavelengths, such as 10 Angstroms.

The fabrication sequence described hereinafter, taken in conjunction with the accompanying drawings, produces gradient index x-ray optics in the 0.5–4.0 keV energy region, a region previously not considered practical for sputtered-sliced transmissive optics. It will be seen that the following fabrication process expands the state of the art in both the fabrication of sputtered-sliced optics and soft x-ray optics by the unique polishing and testing sequence described hereinafter. The specific sequence of operational steps are set forth to illustrate the fabrication process and include specific materials, parameters, etc., as examples only, and it is recognized that certain of the specifically described sequence of steps can be modified and interchanged, and different materials, parameters, etc., used without departing from the scope of this invention. The operational steps are as follows for a material combination known to work at 8 keV.

Figure 2:
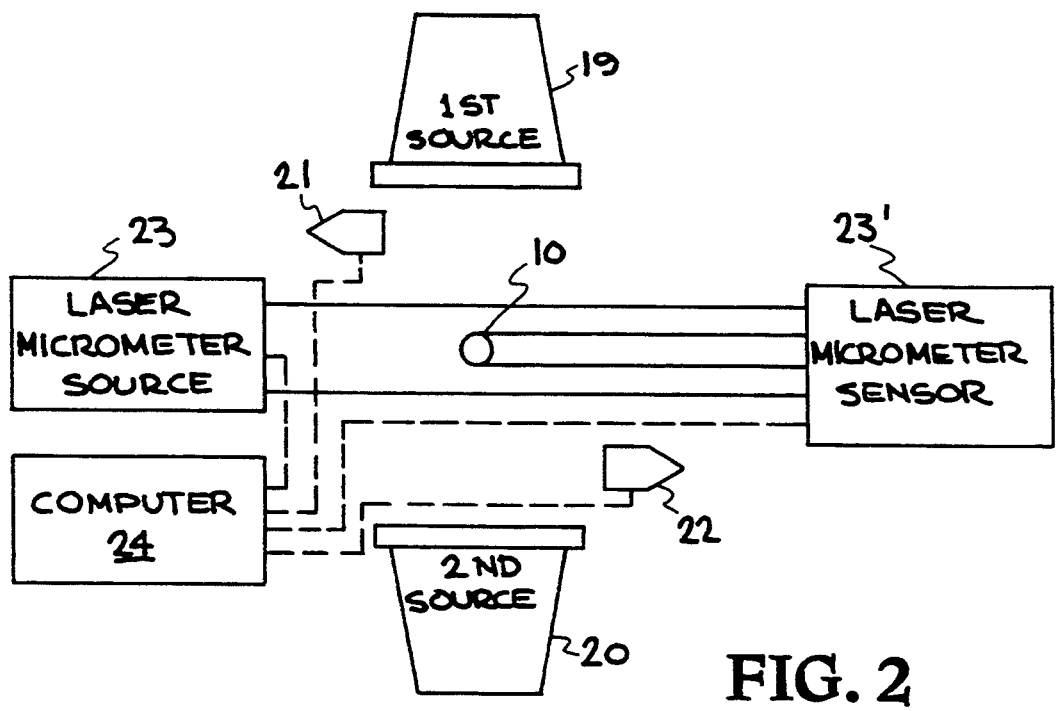
FIG. 2 schematically illustrates a sputtering system for producing the coated wire and optic of FIG. 1.

Step 1. As illustrated in FIG. 1, chemically homogenous multilayers (only three layers illustrated for simplicity) are deposited onto a rotating wire 10, composed of stainless steel with a diameter of 10 to 100 microns, by co-sputtering aluminum (Al) and Copper (Cu) forming a coating or film 11 composed of layers 12–17 having a varying thickness to produce a coated wire 10 having layers of gradient index material. Note that an inner layer is thicker than the adjacent outer layer such that each layer has the same area. The apparatus for carrying out the co-sputtering is illustrated in FIG. 2 and basically comprises first and second source sputtering guns 19 and 20 for depositing material onto wire 10 mounted on a rotating mandrel, not shown, each source having a crystal monitor 21 and 22 to track the substrate deposition rate and a scanning laser micrometer source 23 and laser micrometer sensor 23' continuously monitors the growth on wire 10, with signals from the monitors 21 and 22 and the laser micrometer source and sensor 23 and 23' being fed to a computer 24 as indicated by dashed lines which controls sputtering guns 19 and 20 based on a previously determined lens design. The co-sputtering rate is varied by individually controlling each sputtering source from a near zero watts to maximum wattage, such that when the first source 19 is sputtering at maximum rate the second source 20 is sputtering at or near a zero rate. Thus, the composition of the sputtered layers vary such that one layer will be near 100% of one material from the source 19 with subsequent layers being composed of varying amounts of both materials from both sources to a point where a layer will be near 100% of a second material from the source 20. A layer can be decreased to approach atomic dimensions. The number of layers (which may vary from 3 to several dozen or more) and the composition and thickness thereof is controlled by design software. For greater details of the sputtering process and apparatus of FIG. 2, see above referenced articled entitled "8 keV X-Ray Zone Plates" by R. M. Bionta et al.

The computer 24 is used to acquire and analyze the signals from the sputtering chamber. A Kalman filter, not shown, using state variables to represent each physical quantity in real time is used to describe the state of the system. For example, the wire radius, the tool factors from each gun, the multiplicative constant relating the sputter rate onto each crystal with the power applied to that particular gun are currently used state variables. The Kalman filter allows the use of an accurate, non-precise laser micrometer with precise, non-accurate crystal monitors to deposit layers of the correct thickness in the proper position.

By way of example, using the co-sputtering technique of this invention, layer 12 may be composed essentially of 100% Al, while layers 13, 14, 15 and 16 may be 75%, 50%, 25%, and 0%, respectively, of Al, with layer 16 being composed essentially of 100% Cu, with layer 17 repeating the sequence.

It is within the scope of the modified co-sputtering technique of this invention to use more than two co-sputtered materials, and thus each sputtering source would be individually controlled so as to produce desired layer compositions of the various materials and thus the composition of the layers may vary from 100% to 0% of any of the materials. Either or both sources may contain a compound (two or more chemical elements).

Step 2: Slice the thus coated wire of FIG. 1 perpendicular to the film growth direction to a desired thickness, for example about 0.05 inch (1270 microns), thereby forming a gradient index optic 25. The slicing may be carried out using a metallographic saw, as known in the art. Depending on the type of optic desired central wire 10 from the optic 25 may be dissolved, leaving the optic with a central opening or hole.

Figure 3A:
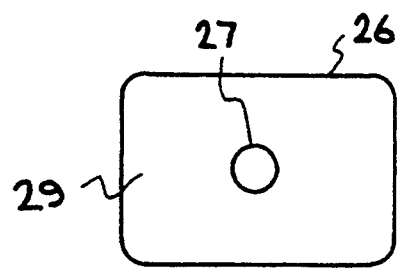
FIGS. 3A–3C are front, top and side views of a mounting block for an optic to be thinned and tested in accordance with the invention.
Figure 3B:
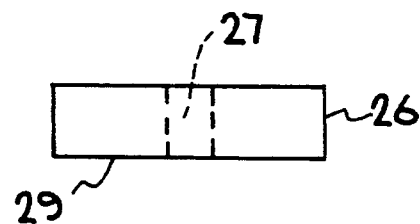
Figure 3C:
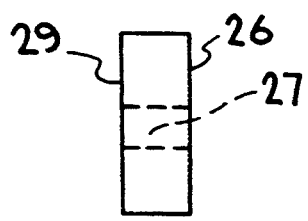

Step 3: Form a mounting block 26 having an opening or hole 27 from copper having a nominal thickness of 0.25 inch, a nominal length of 1.8 inch, and nominal width of 1.0 inch, as shown in FIGS. 3A-3C.

Figure 4:
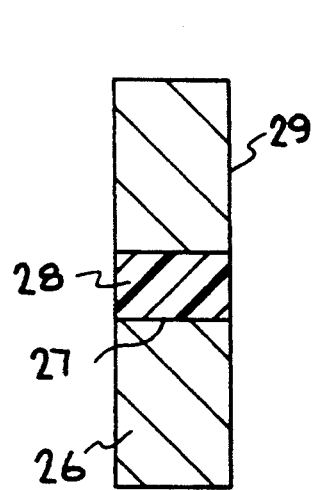
FIG. 4 is an enlarged view of FIG. 3C with the hole therein plugged with a material nearly transparent to the x-ray energy of interest.

Step 4: Fill or plug the opening 27 in the mounting block 26 with dissolvable material 28, such as an epoxy or KCl salt, as shown in FIG. 4.

Step 5: Polish the face or front 29 of the mounting block and the dissolvable material 28 to produce a flat surface, by conventional polishing procedures, such as described in the above-referenced articles by R. M. Bionta et al.

Figure 5:
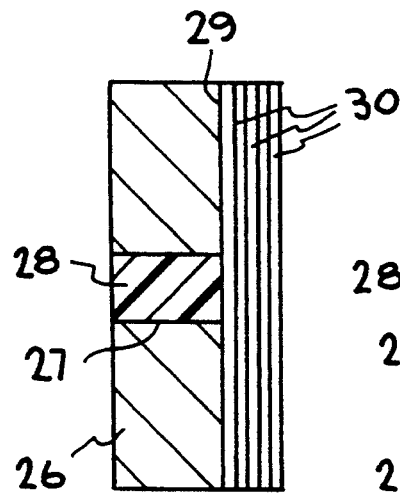
FIG. 5 is an enlarged view similar to FIG. 4 and provided with a multilayer coating on the face or front surface of the mounting block of FIG. 3A.

Step 6: Coat the polished side of the mounting block with multilayers 30 of aluminum (Al) and beryllium (Be), or separate layers of these materials, to provide mechanical support yet being relatively transparent to the x-rays of interest, to a thickness of several microns, as shown in FIG. 5.

Step 7: Polish one side of the optic 25 by conventional means and/or by ion-beam polishing, such as described in the above-referenced articles by R. M. Bionta et al.

Figure 6:
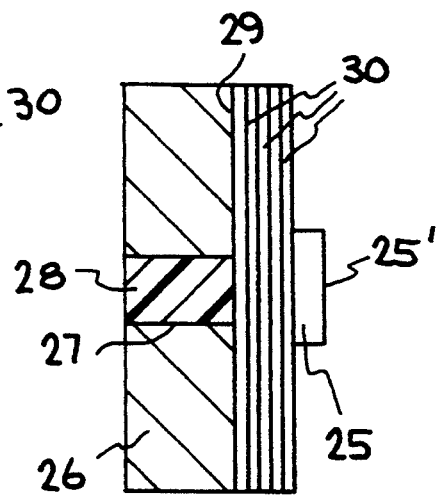
FIG. 6 is an enlarged view of FIG. 3B, illustrating the plugged hole, multilayer coating, and the optic mounted on the mounting block via the multilayer coating.

Step 8: Mount the optic 25 on the multilayer coating 30 over the hole 27 such that the polished side of the optic contacts the coating 30, as shown in FIG. 6, by a suitable epoxy.

Step 9: Polish the face 25' of mounted optic 25 by conventional procedures to reduce the thickness thereof to about 5 microns.

Figure 7A:
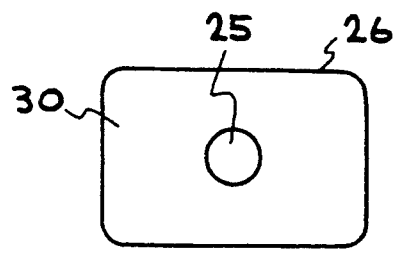
FIGS. 7A–7C are similar to the FIGS. 3A–3C mounting block with the multilayer coating and optic positioned thereon for ion thinning and efficiency testing.
Figure 7B:
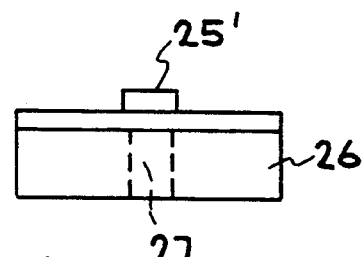
Figure 7C:
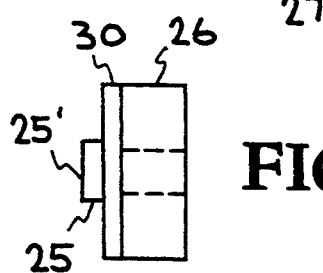

Step 10: Remove the dissolvable material 28 from the hole 27 in the mounting block 26, see FIGS. 7A-7C.

Figure 9:
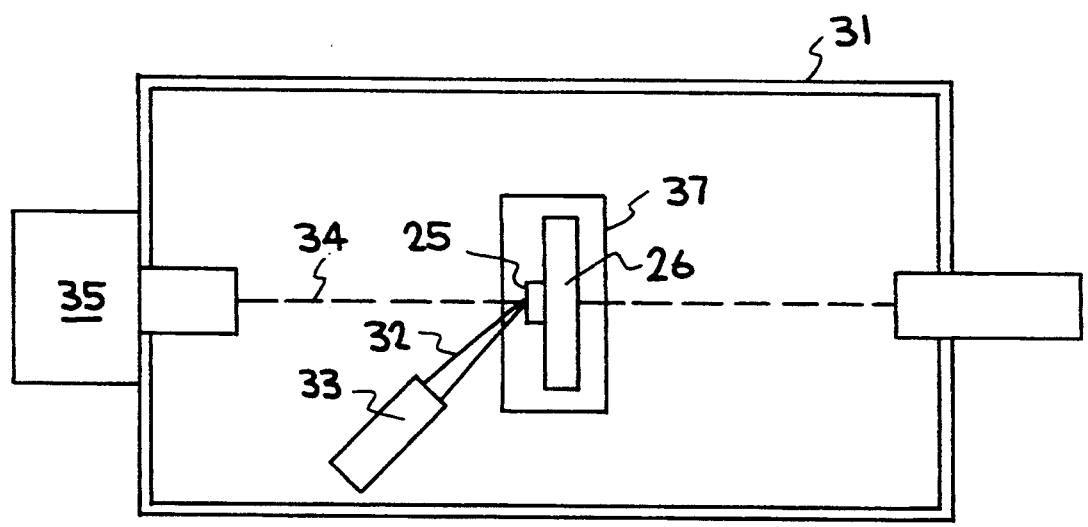
FIG. 9 is a schematic of an ion-thinner/efficiency testing chamber for the optic.

Step 11: Place the thus mounted gradient index optic of FIGS. 6 and 7A-7C in an ion beam thinning and testing vacuum chamber or apparatus generally indicated at 31 and illustrated in FIG. 9, and flow a sputtering gas, such as Argon, in the chamber at about $8 \times 10^{-4}$ Torr.

Figure 8:
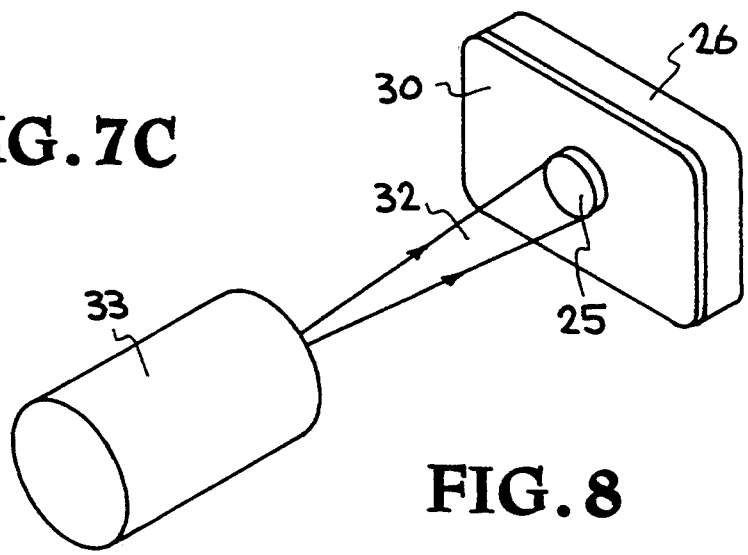
FIG. 8 illustrates an ion source directing a beam of ions onto the optic at a glancing angle of incidence for ion-thinning of the optic.

Step 12: Remove material from the outer surface or face 25' of the optic 25 using a beam 32 of accelerated inert ions produced by an ion source 33, as shown in FIG. 8 and located in the apparatus 31 of FIG. 9. The beam 32 of ions are directed onto optic 25 at an angle of incidence of 0° to 90° (see FIG. 8), and with the ion-thinning source 33 operating at an accelerating voltage of 500 volts with ions, e.g. Argon (Ar), at a flow rate of 2 sccm (standard cubic centimeter per minute), which removes the material from the face of optic 25 at a rate of tens of Angstroms per second.

Step 13: Periodically, during the ion-thinning operation, measuring the efficiency of the optic 25 by directing an x-ray beam 34 produced by an x-ray source 35 in the test chamber 31 of FIG. 9 onto the optic 25, which is detected by the detector mechanism 36 of the test chamber 31. The efficiency varies with thickness, and the x-ray beam 34 passes through the optic 25 at the desired thickness. The x-ray source 35 and the detection mechanism 36 are in most applications located external to vacuum chamber 31.

Step 14: Continue ion-thinning and periodic efficiency measuring to the desired lens thickness where the beam 34 passes through the optics 25, such as a thickness resolution of 0.05 to 3 microns for the final gradient index lens or optic. The mounting block 26 is mounted on a movable support 37 and the position of the mounting block within chamber 31 can be varied with respect to the detection mechanism 36 for alignment purposes. The ion beam thinning of steps 12 and 14 may be done outside the lens efficiency test chamber 31 of FIG. 9. Also, the ion beam thinning can be made to remove different materials at nearly the same rate, which would be difficult with chemical thinning methods.

It has thus been shown that the present invention expands the sputtered-sliced technique and provides a process for fabricating transmissive gradient index x-ray optics for the 0.5-4.0 keV energy region, a region previously not considered practical for sputtered-sliced transmissive optics. While the invention is particularly applicable for use such as x-ray lithography of integrated circuits using 8-13 Å radiation, it also has applications in biological imaging, surface science, x-ray microscopy and imaging, non-destructive analysis, synchrotrons, and demagnification of x-ray lithography masks to expose x-ray photoresist.

It is again pointed out that the specific materials, parameters, etc. described above are to set forth a specific example of the invention, and the invention should not be limited to these specifics. Also, as pointed out above, certain of the operational steps can be interchanged or omitted. For example, steps 1-2 could be omitted if the optic formed thereby was available from another source. Further, step 3 could be omitted if the mounting block was available from another source. Further, as pointed out above, the ion-thinning and lens efficiency testing steps can be carried out by separate apparatus.

While the operational steps of the invention, and apparatus utilized for carrying out these steps, have been described and/or shown in the drawings, and particular examples of materials, parameters, etc., have been set forth to illustrate the principles of the invention, modifications and changes will become apparent to those skilled in the art. The invention is not to be limited by the specific sequence of steps described, or by the materials and parameters utilized in the description, or the apparatus illustrated, and is to be limited only by the scope of the appended claims.

We claim:

1. In a sputtered-sliced process for fabricating optics by sputtering materials on a substrate, the improvement comprising the step of:
    forming a film on the substrate by co-sputtering layers of equal areas of materials to produce a concentration gradient across a zone, which results in a gradient in the index of refraction, thereby producing a gradient index optic.

2. The improvement of claim 1, additionally including the step of removing a portion of the co-sputtered film by ion-thinning.

3. The improvement of claim 2, wherein the step of ion-thinning is carried out by directing ions from a source onto the optic at an angle of incidence of up to about 90°.

4. The improvement of claim 2, additionally including the steps of periodically testing the efficiency level of the optic during the ion-thinning step, and terminating the ion-thinning when an efficiency is obtained.

5. The improvement of claim 4, wherein the steps of ion-thinning and efficiency testing are carried out in a testing chamber, and the step of efficiency testing includes placing the optic in an x-ray beam.

6. The improvement of claim 1, wherein the step of co-sputtering is carried out on a substrate constituting a rotating wire.

7. The improvement of claim 2, additionally including the step of placing the gradient index optic formed by the sputtered-sliced process on a mounting block having a multi-layer coating thereon to provide mechanical support for the optic.

8. The improvement of claim 7, wherein the step of ion-thinning step is carried out by directing ions from a source onto the thus formed gradient index optic at an angle of incidence in the range between about 0° to about 90°.

9. The improvement of claim 8, additionally including the step of periodically testing the optic for efficiency by placing it in an x-ray beam during the ion-thinning step, and terminating the ion-thinning upon the optic being thinned to a point of an optic efficiency level.

10. The improvement of claim 9, wherein the mounting block and optic mounted therein are placed in a testing chamber wherein the steps of ion-thinning and efficiency testing are carried out.

11. A process for fabricating a gradient index optic for the 0.5–4.0 keV energy range, comprising the steps of:
   placing a gradient index optic, formed by co-sputtering different materials on a substrate, on a mounting block having a coating thereon;
   removing material from the optic by ion-thinning;
   periodically, during the ion-thinning step, testing the optic for efficiency; and
   terminating the ion-thinning when an efficiency level is obtained.

12. The process of claim 11, additionally including the step of placing the mounting block and optic in a testing chamber within which the ion-thinning and efficiency testing of the optic are carried out.

13. The process of claim 11, wherein the step of ion-thinning is carried out by directing ions from a source onto the optic at an angle of incidence.

14. The process of claim 11, additionally including the step of forming the gradient index optic by: co-sputtering material onto a rotating substrate to form a multi-layer film thereon, and slicing the thus formed substrate and film perpendicular to the film growth direction in a thicknesses to form gradient index optics.

15. The process of claim 11, additionally including the step of forming the coated mounting block by: providing a block of material, forming a hole through the block of material, plugging the hole with a dissolvable material, polishing at least one surface of the block of material, and depositing a coating of material on the polished surface of the block of material.

16. A process for fabricating transmissive gradient index x-ray optics for the 0.5–4.0 keV energy range, comprising the steps of:
   co-sputtering different materials on a rotating substrate to form a coating of thickness having a concentration gradient thereacross;
   slicing the thus coated substrate perpendicular to the film growth direction to produce a gradient index optic of a thickness;
   forming a mounting block having a hole therein from a material;
   filling the hole in the mounting block with a dissolvable material;
   polishing one side of the mounting block and the material within the hole to produce a flat surface;
   depositing materials transparent to x-rays of interest on the polished side of the mounting block to form a coating of a thickness;
   polishing one side of the thus formed gradient index optic;
   mounting the gradient index optic on the mounting block such that the polished side of the optic is placed in contact with the coating thereon and over the hole in the mounting block;
   polishing the mounted optic to reduce the thickness thereof;
   dissolving the material in the hole of the mounting block;
   removing material from the face of the gradient index optic by ion-thinning;
   periodically, during the ion-thinning, testing the efficiency of the gradient index optic; and
   terminating the ion-thinning when an efficiency level of the optic is reached.

17. The process of claim 16, additionally including the step of using a Kalman filter using state variables to describe the instantaneous condition of the system to control the film deposition.

18. The process of claim 16, wherein the step of removing material from the face of the optic by ion-thinning is carried out by directing ions from a source onto the face of the optic at an angle of incidence.

19. The process of claim 18, wherein the steps of removing material and testing of efficiency are carried out in a test chamber by positioning the optic intermediate an x-ray source and a detection mechanism, such that an x-ray beam from the source is directed through the hole in the mounting block.

20. The process of claim 19, wherein the step of slicing is carried out so as to produce slices having a thickness of about 0.05 inch (1270 microns).

21. The process of claim 20, wherein the coating on the mounting block is composed of multiple layers of Al/Be.

22. The process of claim 21, wherein the step of polishing the mounted optic reduces the thickness thereof to about 5 microns.

23. The process of claim 22, wherein the material is removed by ion-thinning to produce a final optic having a thickness resolution of 0.05 to 3 microns.

24. The process of claim 23, wherein the dissolvable material is selected from a salt and an epoxy.

25. The process of claim 24, wherein the salt is KBr.

26. The process of claim 16, wherein the step of co-sputtering desired material on the substrate is carried out by:

providing a sputtering source for each of the materials;

providing means for controlling each of the sputtering sources for producing minimum and maximum sputtering output thereof; and controlling each of the sputtering sources such that the sources are at different sputtering outputs.

27. The process of claim 26, wherein two sputtering sources are provided, and wherein each of the sputtering sources is controlling such that one is at maximum sputtering output while the other is at minimum sputtering output.

28. The process of claim 18, additionally including the steps of forming the testing chamber by:

providing a vacuum chamber having means to control the vacuum therein;

providing an x-ray source for directing a beam of x-rays at least partially across the chamber;

positioning an x-ray detection mechanism with respect to the chamber so as to be in alignment with the beam of x-rays;

providing the chamber with a means for supporting an optic mounting block intermediate the x-ray source and the detection mechanism; and providing an ion source capable of directing a beam of ions onto an optic located in the chamber at an angle of incidence.

29. The process of claim 28, additionally including the steps of testing an optic for efficiency in the thus formed testing chamber, comprising:

positioning the mounting block to which the optic is mounted in the means for supporting the mounting block;

aligning the hole in the mounting block with the x-ray source and detection mechanism such that the x-ray beam will pass through the hole; and directing the x-ray beam onto the optic; whereby if the optic has been thinned to a thickness the x-ray beam will pass therethrough and be detected by the detection mechanism.

30. The process of claim 28, additionally including the step of providing the testing chamber with means for moving the optic mounting block support means with respect to the detection mechanism.

31. The improvement in the process of claim 1, wherein the step of co-sputtering is carried out using a computer and a Kalman filter to control the thickness of the co-sputtered materials.

* * * * *